United States Patent
Kuwana et al.

(10) Patent No.: US 8,368,366 B2
(45) Date of Patent: Feb. 5, 2013

(54) DRIVER CIRCUIT AND TEST APPARATUS

(75) Inventors: Yuji Kuwana, Gunma-ken (JP); Naoki Matsumoto, Saitama-ken (JP); Yasuhiro Urabe, Gunma (JP)

(73) Assignee: Advantest Corporation, Tokyo (JP)

( * ) Notice: Subject to any disclaimer, the term of this patent is extended or adjusted under 35 U.S.C. 154(b) by 750 days.

(21) Appl. No.: 12/553,755

(22) Filed: Sep. 3, 2009

(65) Prior Publication Data
US 2011/0050194 A1 Mar. 3, 2011

(51) Int. Cl.
*G05F 1/40* (2006.01)
(52) U.S. Cl. .................................................. 323/271
(58) Field of Classification Search .................. 323/268, 323/271, 282, 299; 324/756.01, 762.01, 324/764.01; 327/108, 109
See application file for complete search history.

(56) References Cited

U.S. PATENT DOCUMENTS

| | | | | |
|---|---|---|---|---|
| 6,876,231 B2* | 4/2005 | Shimasaki | | 326/91 |
| 7,230,452 B2* | 6/2007 | Hoon et al. | | 326/83 |
| 7,511,540 B2* | 3/2009 | Dickman et al. | | 327/108 |
| 2007/0210780 A1* | 9/2007 | Kataoka | | 323/285 |

* cited by examiner

*Primary Examiner* — Matthew Nguyen

(57) ABSTRACT

Provided is a driver circuit that outputs, from an output end, an output signal corresponding to an input signal supplied thereto, comprising an output resistance section that is provided between a constant voltage source and the output end; an output switching section that switches voltage of the output end according to the input signal; and a switching section that switches a resistance value of the output resistance section. The output resistance section includes an output resistance FET having a source/drain connection between the constant voltage source and the output end, and the switching section supplies a control voltage to a gate of the output resistance FET such that the resistance between the source and the drain of the output resistance FET switches to a designated value.

14 Claims, 8 Drawing Sheets

DRIVER CIRCUIT AND TEST APPARATUS

BACKGROUND

1. Technical Field

The present invention relates to a driver circuit and a test apparatus.

2. Related Art

A type of driver circuit called CML (Current Mode Logic) is known. The CML is provided with a pair of transistors switching between inverse phases according to a differential input signal, a pair of resistors that pull up collectors of the pair of transistors to a constant voltage source, and a constant current source that is connected commonly to emitters of the pair of transistors. Such a CML outputs an output signal from the collectors of the pair of transistors.

In the CML, the voltage amplitude of the output signal is equal to the product of (i) the resistance values of the resistors pulled up to the constant voltage source from the collectors of the transistors and (ii) the current value of the constant current source. Accordingly, in the CML, providing larger resistances for the pull up resistors increases the voltage amplitude of the output signal.

Furthermore, in the CML, the logic transition time of the output signal is proportional to the product of (i) the resistance values of the pull up resistors and (ii) the capacitance value of the parasitic capacitance connected to the collectors of the transistors. Accordingly, the CML can shorten the logic transition time of the output signal by decreasing the resistances of the pull up resistors.

In order to achieve both large-amplitude and high-speed operation in a single CML device, however, the pull up resistors must have small resistances and the constant current source must have a large current value. But when the current value of the constant current source is increased, the consumed power increases as well.

SUMMARY

Therefore, it is an object of an aspect of the innovations herein to provide a driver circuit and a test apparatus, which are capable of overcoming the above drawbacks accompanying the related art. The above and other objects can be achieved by combinations described in the independent claims. The dependent claims define further advantageous and exemplary combinations of the innovations herein.

According to a first aspect related to the innovations herein, one exemplary driver circuit may include a driver circuit that outputs, from an output end, an output signal corresponding to an input signal supplied thereto, comprising an output resistance section that is provided between a constant voltage source and the output end; an output switching section that switches voltage of the output end according to the input signal; and a switching section that switches a resistance value of the output resistance section. The driver circuit may be provided in a test apparatus.

The summary clause does not necessarily describe all necessary features of the embodiments of the present invention. The present invention may also be a sub-combination of the features described above. The above and other features and advantages of the present invention will become more apparent from the following description of the embodiments taken in conjunction with the accompanying drawings.

DESCRIPTION OF EXEMPLARY EMBODIMENTS

Hereinafter, some embodiments of the present invention will be described. The embodiments do not limit the invention according to the claims, and all the combinations of the features described in the embodiments are not necessarily essential to means provided by aspects of the invention.

Figure 1:
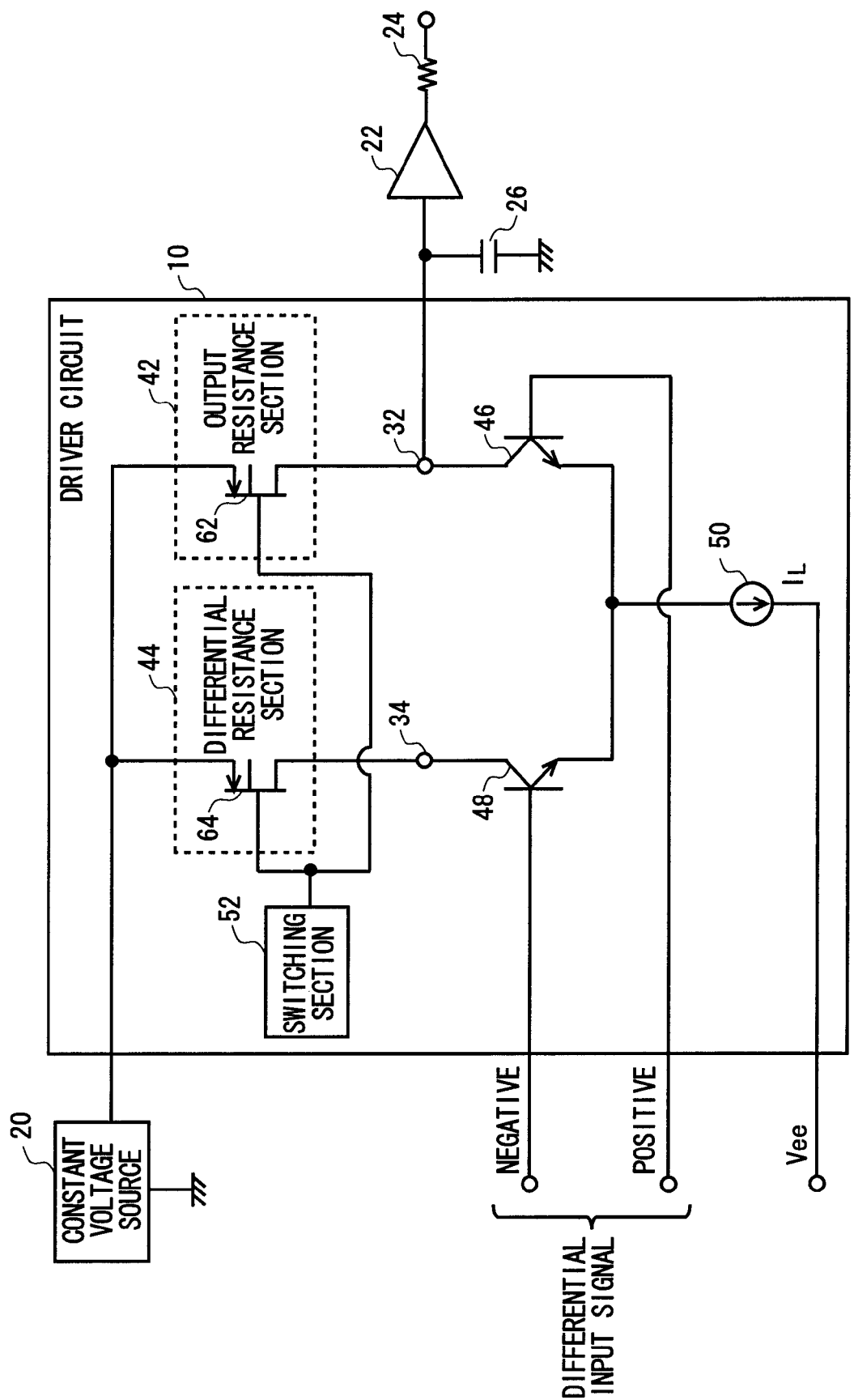
FIG. 1 shows a configuration of a driver circuit 10 according to an embodiment of the present invention, along with a constant voltage source 20, an output buffer 22, a resistor 24, and a parasitic capacitance 26.

FIG. 1 shows a configuration of a driver circuit 10 according to an embodiment of the present invention, along with a constant voltage source 20, an output buffer 22, a resistor 24, and a parasitic capacitance 26. The driver circuit 10 is supplied with a differential input signal, e.g. a positive input signal and a negative input signal, and outputs an output signal corresponding to the input signal from an output end 32.

The driver circuit 10 may output a differential output signal, or may output a single-phase output signal. When outputting a differential output signal, the driver circuit 10 outputs a positive output signal from the output end 32 and a negative output signal from the differential end 34.

The driver circuit 10 is supplied with a constant voltage from the constant voltage source 20. In the present embodiment, the driver circuit 10 supplies the output signal to the output buffer 22. The output buffer 22 supplies an output voltage to a load via the resistor 24, which may have a resistance of 50Ω, for example. The driver circuit 10 has the parasitic capacitance 26 positioned between the output end 32 and a ground.

The driver circuit 10 is provided with an output resistance section 42, a differential resistance section 44, an output switching section 46, a differential switching section 48, a constant current source 50, and a switching section 52.

The output resistance section 42 is provided between the constant voltage source 20 and the output end 32. The resistance value of the output resistance section 42 changes according to control from the outside.

In the present embodiment, the output resistance section 42 includes an output resistance FET 62 (Field Effect Transistor) having a source/drain connection between the constant voltage source 20 and the output end 32. When a constant current flows between the source and the drain, the resistance value of the output resistance FET 62 between the source and the drain changes according to the gate voltage.

The differential resistance section 44 is provided between the constant voltage source 20 and the differential end 34. The resistance value of the differential resistance section 44 changes according to control from the outside. In the present embodiment, the resistance value of the differential resistance section 44 is controlled to be equal to the resistance value of the output resistance section 42.

In the present embodiment, the differential resistance section 44 includes a differential resistance FET 64 having a source/drain connection between the constant voltage source 20 and the differential end 34. The differential resistance FET 64 is designed to have the same characteristics as the output resistance FET 62.

The output switching section 46 switches the voltage of the output end 32 according to an input signal. In the present embodiment, the output switching section 46 provides a connection or disconnect between the output end 32 and the constant current source 50 according to the positive input signal, thereby switching the current flowing between the constant voltage source 20 and the constant current source 50 via the output resistance section 42.

The differential switching section 48 switches, with an inverse phase of the output switching section 46, the voltage of the differential end 34 according to the input signal. In the present embodiment, the differential switching section 48 provides a connection or disconnect between the differential end 34 and the constant current source 50 according to the negative input signal, thereby switching, with an inverse phase of the output switching section 46, the current flowing between the constant voltage source 20 and the constant current source 50 via the differential resistance section 44.

The output switching section 46 and the differential switching section 48 may be bipolar transistors or FETs, for example.

The constant current source 50 causes a prescribed constant current to flow. In the present embodiment, the constant current source 50 sets the combined current flowing through the output resistance section 42 and the differential resistance section 44 to be constant.

In this way, when the output switching section 46 is ON and the differential switching section 48 is OFF, the driver circuit 10 causes the voltages of the output end 32 and the differential end 34 to be expressed according to the expressions below. Here, $V_P$ represents the voltage of the output end 32, $V_N$ represents the voltage of the differential end 34, $I_L$ represents the current value of the constant current from the constant current source 50, $V_{CC}$ represents the constant voltage generated by the constant voltage source 20, and R represents the resistance value of the output resistance section 42.

$$V_P = V_{CC} - (I_L \times R)$$

$$V_N = V_{CC}$$

When the output switching section 46 is OFF and the differential switching section 48 is ON, the driver circuit 10 causes the voltages of the output end 32 and the differential end 34 to be expressed according to the expressions below.

$$V_P = V_{CC}$$

$$V_N = V_{CC} - (I_L \times R)$$

In this way, the driver circuit 10 can output an output signal having voltage amplitude equal to a product of the resistance value of the output resistance section 42 and the current value of the constant current source 50.

The switching section 52 switches the resistance values of the output resistance section 42 and the differential resistance section 44. For example, during manufacturing, the switching section 52 sets designated resistance values in the output resistance section 42 and the differential resistance section 44. The switching section 52 may instead set resistance values designated by a user in the output resistance section 42 and the differential resistance section 44 when a user operates the driver circuit 10. In the present embodiment, the switching section 52 supplies the same control voltage to the gate of the output resistance FET 62 and the gate of the differential resistance FET 64, thereby setting the designated resistance values between the sources and drains of the output resistance FET 62 and the differential resistance FET 64.

Here, the switching section 52 can increase the voltage amplitude of the output signal by increasing the resistance values of the output resistance section 42 and the differential resistance section 44. The switching section 52 can shorten the logic transition time of the output signal by decreasing the resistance values of the output resistance section 42 and the differential resistance section 44. In this way, the switching section 52 can switch the characteristics of the driver circuit 10 by changing the resistance values of the output resistance section 42 and the differential resistance section 44.

As described above, the driver circuit 10 can change the voltage amplitude and the logic transition time of the output signal using a simple configuration, and without changing the amount of current flowing through the constant current source 50. Therefore, the driver circuit 10 can be used to realize a device with a wide range of uses that can simply change the characteristics according to a desired objective.

Figure 2:
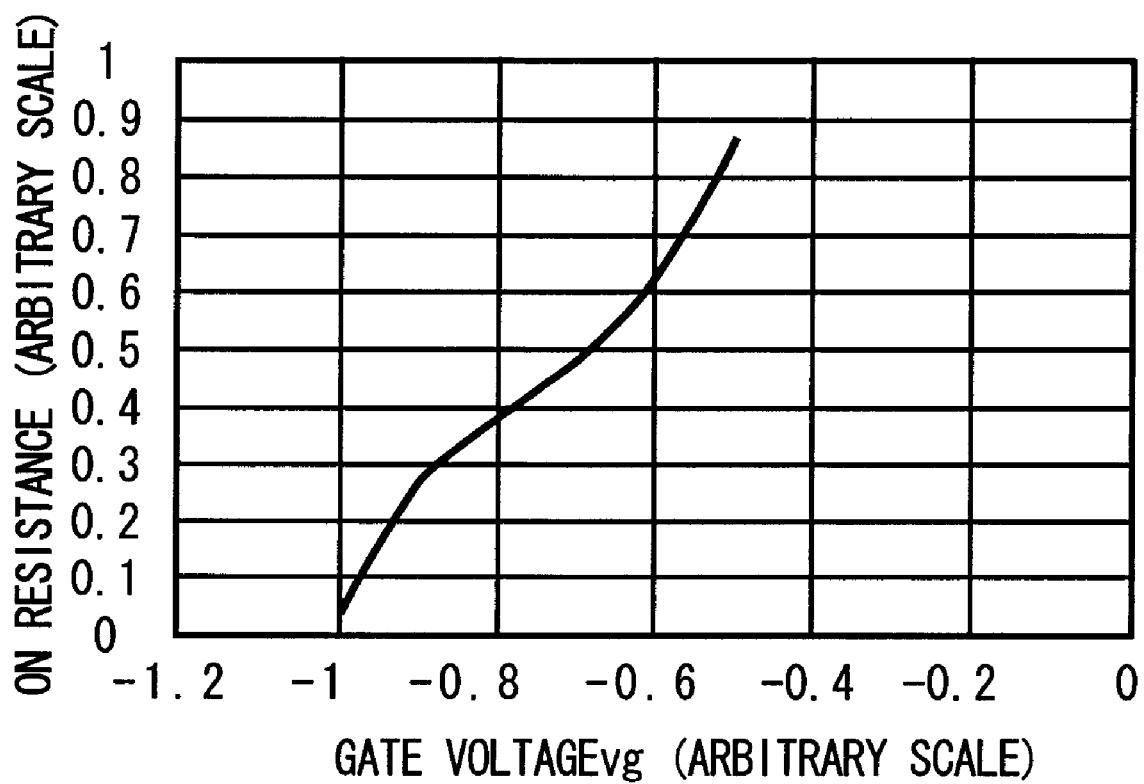
FIG. 2 shows an example of an ON resistance relative to gate voltage of the output resistance FET 62 according to the present embodiment.

FIG. 2 shows an example of an ON resistance, i.e. resistance between source and drain, relative to gate voltage when a constant current flows between the source and the drain in the output resistance FET 62 according to the present embodiment. FIG. 2 represents the gate voltage on a scale from 0 to −1, and represents the ON resistance on a scale from 0 to 1 on the vertical axis.

As shown in FIG. 2, the output resistance FET 62 ON resistance changes substantially proportionally to the gate voltage. Furthermore, the output resistance FET 62 can change the ON resistance within a range that is approximately a 10 times the original value. By including the output resistance FET 62 having these characteristics, the output resistance section 42 can change the amplitude voltage and the logic transition time over a range that is approximately 10 times the original value.

Figure 3:
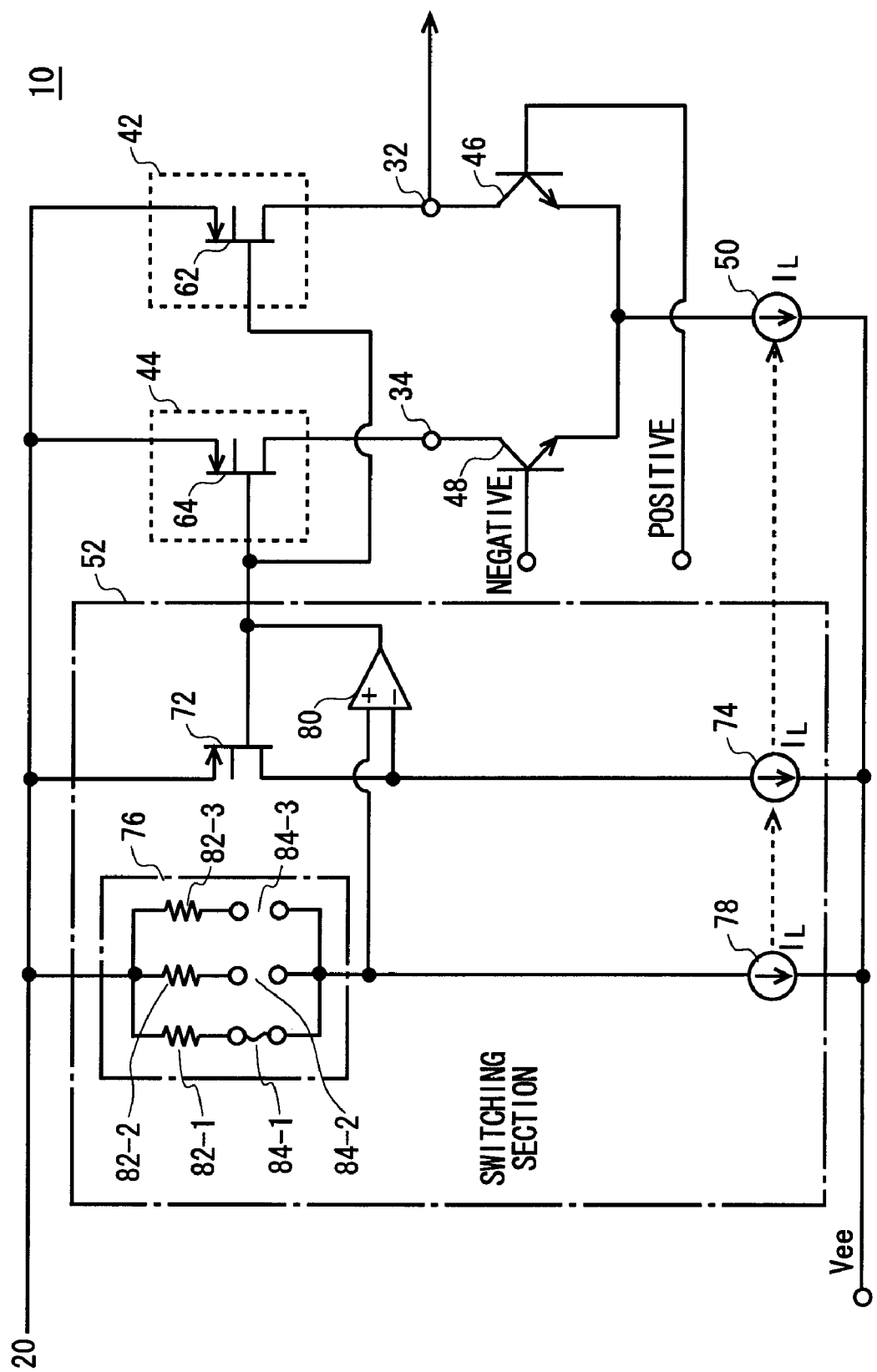
FIG. 3 shows a configuration of the driver circuit 10 according to a first modification of the present embodiment.

FIG. 3 shows a configuration of the driver circuit 10 according to a first modification of the present embodiment. The driver circuit 10 of the present modification adopts the same function and configuration as the driver circuit 10 shown in FIG. 1, and the components of the driver circuit 10 of the present modification adopt the same function and configuration as components having the same reference numeral in the driver circuit 10 described in FIG. 1. Therefore, the following description includes only differing points.

The switching section 52 of the present modification includes a reference FET 72, a reference FET constant current source 74, a reference resistor 76, a reference resistance constant current source 78, and a control voltage applying section 80.

The reference FET 72 has a source/drain connection between the constant voltage source 20 and the reference FET constant current source 74. The reference FET 72 is designed to have the same characteristics as the output resistance FET 62.

The reference FET constant current source 74 causes a constant current, which is the same as the current from the constant current source 50, to flow between the source and drain of the reference FET 72. In other words, the reference FET constant current source 74 causes a current that is equal to the sum of the currents flowing through the output resistance FET 62 of the output resistance section 42 and the output resistance FET 62 of the differential resistance section 44 to flow between the source and the drain of the reference FET 72.

The reference resistor 76 is connected between the constant voltage source 20 and the reference resistance constant current source 78, and has a predetermined resistance value. The reference resistor 76 may include a plurality of resistance elements 82-1 to 82-3 and a plurality of fuses 84-1 to 84-3, for example.

The plurality of resistance elements 82 are connected in parallel. The plurality of resistance elements 82 may each have different resistance values. Each fuse 84 may correspond with a respective resistance element 82. When supplied with a current greater than a prescribed value, each fuse 84 may disconnect the wire connected to one of the terminals of the corresponding resistance element 82.

During manufacturing, this reference resistor 76 may have certain selected fuses 84 from among the plurality of fuses 84 disconnected such that the combined resistance of the plurality of resistance elements 82 becomes the prescribed resistance value. For example, the reference resistor 76 may disconnect all of the fuses 84 corresponding to resistance elements 82 other than the designated resistance elements 82 for achieving the desired resistance value. In this way, a designated resistance value is set for the reference resistor 76 during manufacturing.

The reference resistance constant current source 78 causes a constant current equivalent to the current from the constant current source 50 to flow through the reference resistor 76. In other words, the reference resistance constant current source 78 causes a current that is equal to the sum of the currents flowing through the output resistance FET 62 of the output resistance section 42 and the output resistance FET 62 of the differential resistance section 44 to flow through the reference resistor 76.

The control voltage applying section 80 supplies the gate of the reference FET 72 with a control voltage that causes the voltage of the reference resistor 76 to match the voltage between the source and drain of the reference FET 72. For example, the control voltage applying section 80 may be a differential amplifier that generates a control voltage causing the difference between (i) the voltage between the source and drain of the reference FET 72 and (ii) the voltage between the ends of the reference resistor 76 to be 0. In this way, the control voltage applying section 80 supplies the gate of the reference FET 72 with a control voltage that causes the reference FET 72 to have the designated resistance value between the source and drain.

The control voltage applying section 80 also supplies this type of control voltage to the gates of the output resistance FET 62 and the differential resistance FET 64. In this way, the control voltage applying section 80 can set resistance values between the sources and drains of the output resistance FET 62 and the differential resistance FET 64 that are each the same as the resistance value of the reference resistor 76.

In this way, the driver circuit 10 of the present modification can switch the resistance values of the output resistance section 42 and the differential resistance section 44 to be the designated resistance values.

Figure 4:
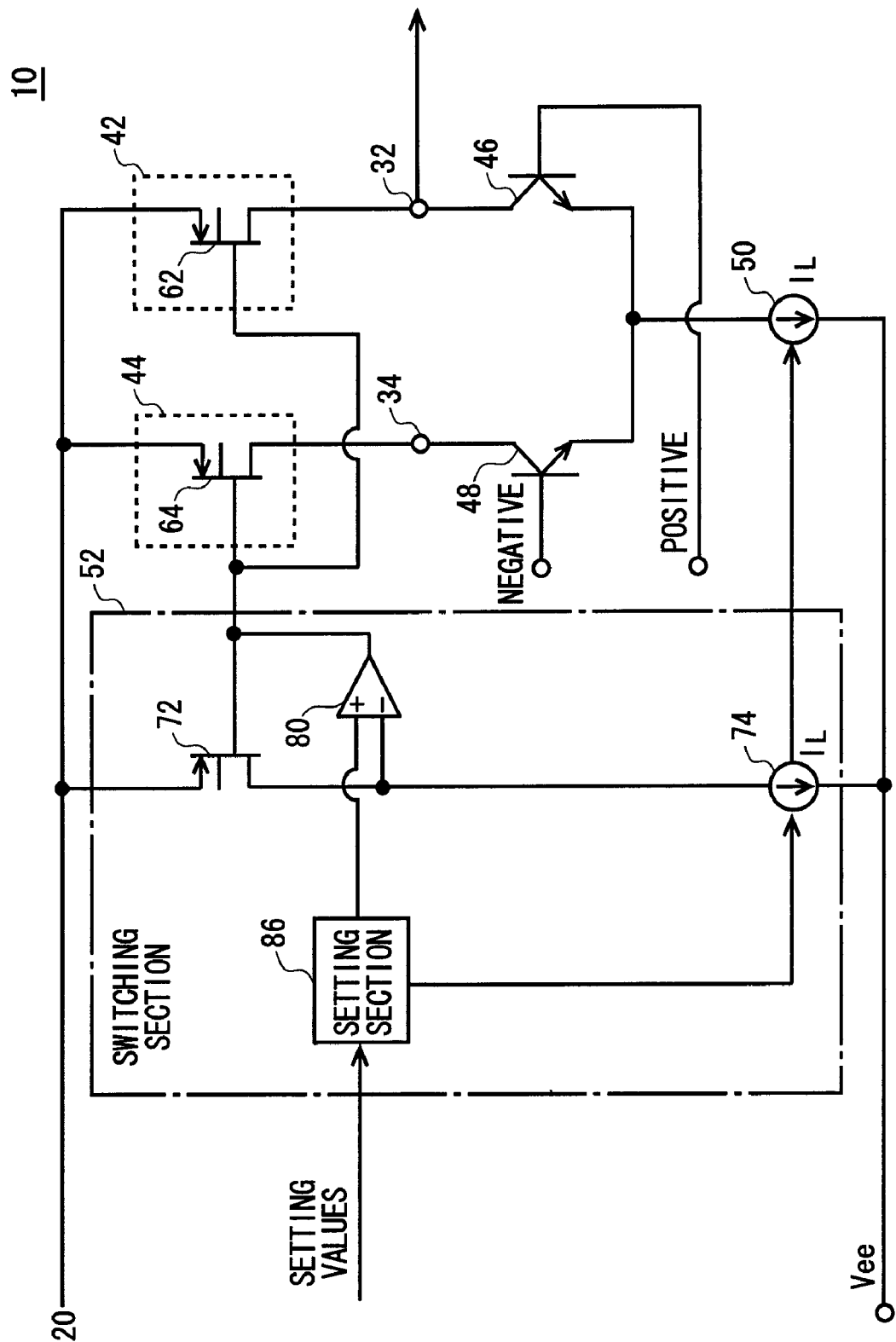
FIG. 4 shows a configuration of the driver circuit 10 according to a second modification of the present embodiment.

FIG. 4 shows a configuration of the driver circuit 10 according to a second modification of the present embodiment. The driver circuit 10 of the present modification adopts the same function and configuration as the driver circuit 10 shown in FIG. 1, and the components of the driver circuit 10 of the present modification adopt the same function and configuration as components having the same reference numeral in the driver circuit 10 described in FIG. 1. Therefore, the following description includes only differing points.

The switching section 52 of the present modification includes the reference FET 72, the reference FET constant current source 74, the control voltage applying section 80, and a setting section 86. The setting section 86 receives, from the outside, designation of a voltage amplitude and logic transition time of the output signal. The setting section 86 sets the current value of the current from the constant current source 50 and the resistance values of the output resistance section 42 and the differential resistance section 44 according to the designated voltage amplitude and logic transition time.

For example, the setting section 86 sets the resistance values of the output resistance section 42 and the differential resistance section 44 by supplying a setting voltage to the control voltage applying section 80. The control voltage applying section 80 outputs a control voltage that causes the setting voltage and the voltage between the source and drain of the reference FET 72 to be equal. The control voltage applying section 80 supplies this control voltage to the gates of the reference FET 72, the output resistance FET 62, and the differential resistance FET 64.

The setting section 86 may store in advance a list of current values for the constant current source 50 and resistance values for the output resistance section 42 and the differential resistance section 44 that correspond to resulting combinations of voltage amplitudes and transition times. Upon receiving a designation for amplitude voltage and transition time from the outside, the setting section 86 selects the corresponding resistance values and current value from the list. The setting section 86 adjusts the output resistance section 42 and the differential resistance section 44 to have the selected resistance values, and adjusts the current flowing from the constant current source 50 to have the selected current value.

In this way, the driver circuit 10 of the present modification can output a signal having a voltage amplitude and transition time designated by a user.

Figure 5:
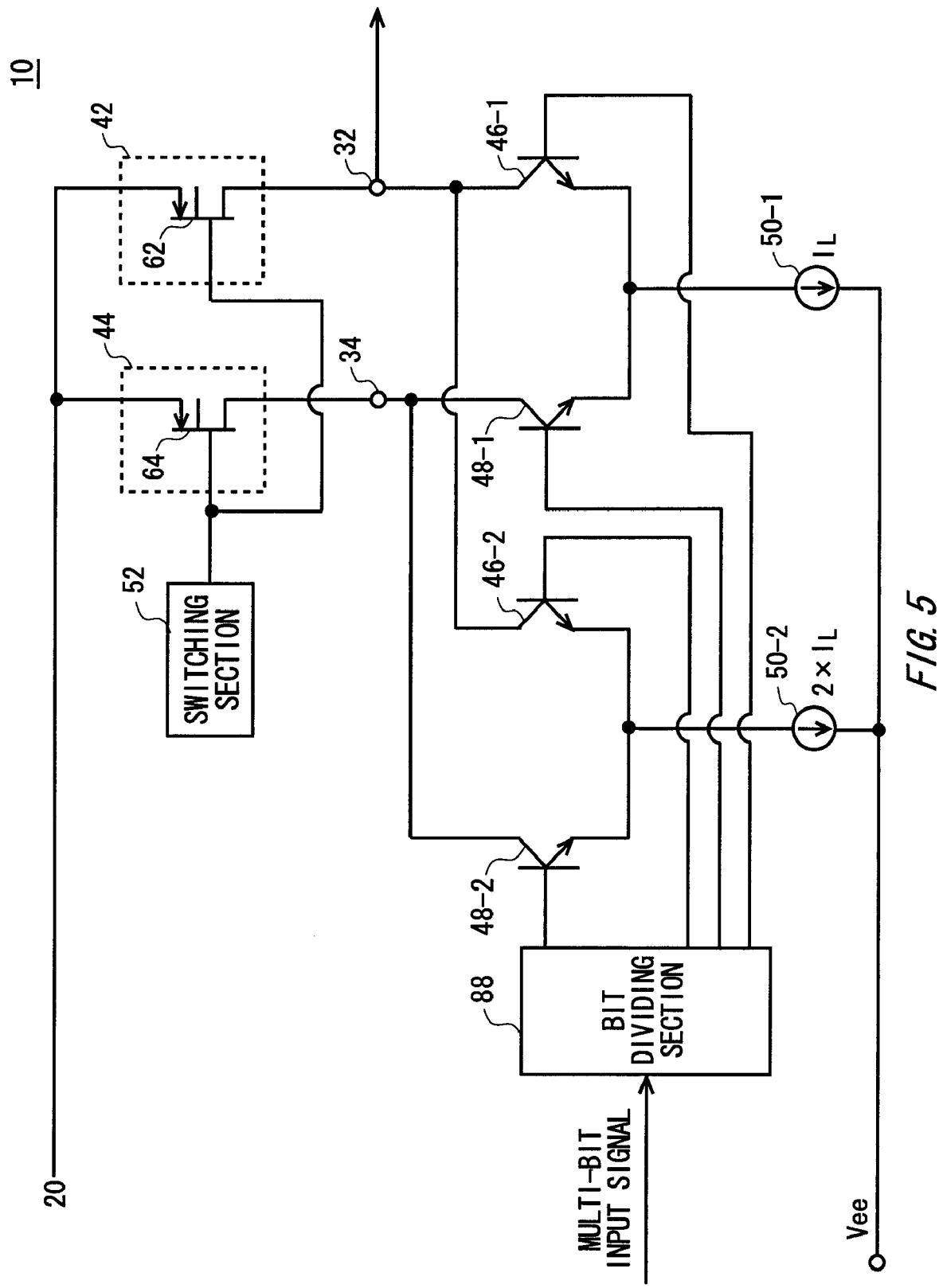
FIG. 5 shows a configuration of the driver circuit 10 according to a third modification of the present embodiment.

FIG. 5 shows a configuration of the driver circuit 10 according to a third modification of the present embodiment. The driver circuit 10 of the present modification adopts the same function and configuration as the driver circuit 10 shown in FIG. 1, and the components of the driver circuit 10 of the present modification adopt the same function and configuration as components having the same reference numeral in the driver circuit 10 described in FIG. 1. Therefore, the following description includes only differing points.

The driver circuit 10 of the present modification includes the output resistance section 42, the differential resistance section 44, a bit dividing section 88, a plurality of the output switching sections 46, a plurality of the differential switching sections 48, a plurality of the constant current sources 50, and the switching section 52.

The bit dividing section 88 receives a multivalued input signal expressed by a plurality of bits from the outside. The bit dividing section 88 divides the input signal into signals that each correspond to a bit. In the example shown in FIG. 5, the bit dividing section 88 divides a differential input signal expressed by 2 bit values into a differential signal representing the first bit value and a differential signal representing the second bit value.

The plurality of constant current sources 50 are provided to correspond respectively to the bits of the input signal, and each output a current corresponding to the weighting of the corresponding bit. In the example shown in FIG. 5, the first constant current source 50-1 corresponding to the first bit causes a current $I_L$ to flow. The second constant current source 50-2 corresponding to the second bit causes a current $(2 \times I_L)$ to flow, this current being twice the amount of the current $I_L$ from the first constant current source 50-1.

The plurality of output switching sections 46 are provided to correspond respectively to the bits of the input signal. Each output switching section 46 switches the current flowing between the constant voltage source 20 and the corresponding constant current source 50 via the output resistance section 42, according to the value of the corresponding bit.

In the example shown in FIG. 5, the first output switching section 46-1 corresponding to the first bit switches whether the current $(I_L)$ of the first constant current source 50-1 flows through the output resistance section 42, according to a positive signal representing the value of the first bit. The second output switching section 46-2 corresponding to the second bit switches whether the current $(2 \times I_L)$ of the second constant current source 50-2 flows through the output resistance section 42, according to a positive signal representing the value of the second bit.

The plurality of differential switching sections 48 are provided to correspond respectively to the plurality of bits of the input signal. Each differential switching section 48 switches the current flowing between the constant voltage source 20 and the corresponding constant current source 50 via the differential resistance section 44, with an inverse phase of the output switching section 46 of the corresponding bit, according to the value of the corresponding bit.

In the example shown in FIG. 5, the first differential switching section 48-1 corresponding to the first bit switches whether the current $(I_L)$ of the first constant current source 50-1 flows through the differential resistance section 44, according to a negative signal representing the value of the first bit. The second differential switching section 48-2 corresponding to the second bit switches whether the current $(2 \times I_L)$ of the second constant current source 50-2 flows through the differential resistance section 44, according to a negative signal representing the value of the second bit.

In this way, the driver circuit 10 according to the present modification can output an output signal corresponding to the multivalued input signal. Therefore, the driver circuit 10 of the present modification can switch the voltage amplitude and logic transition time of a multivalued output signal.

Figure 6:
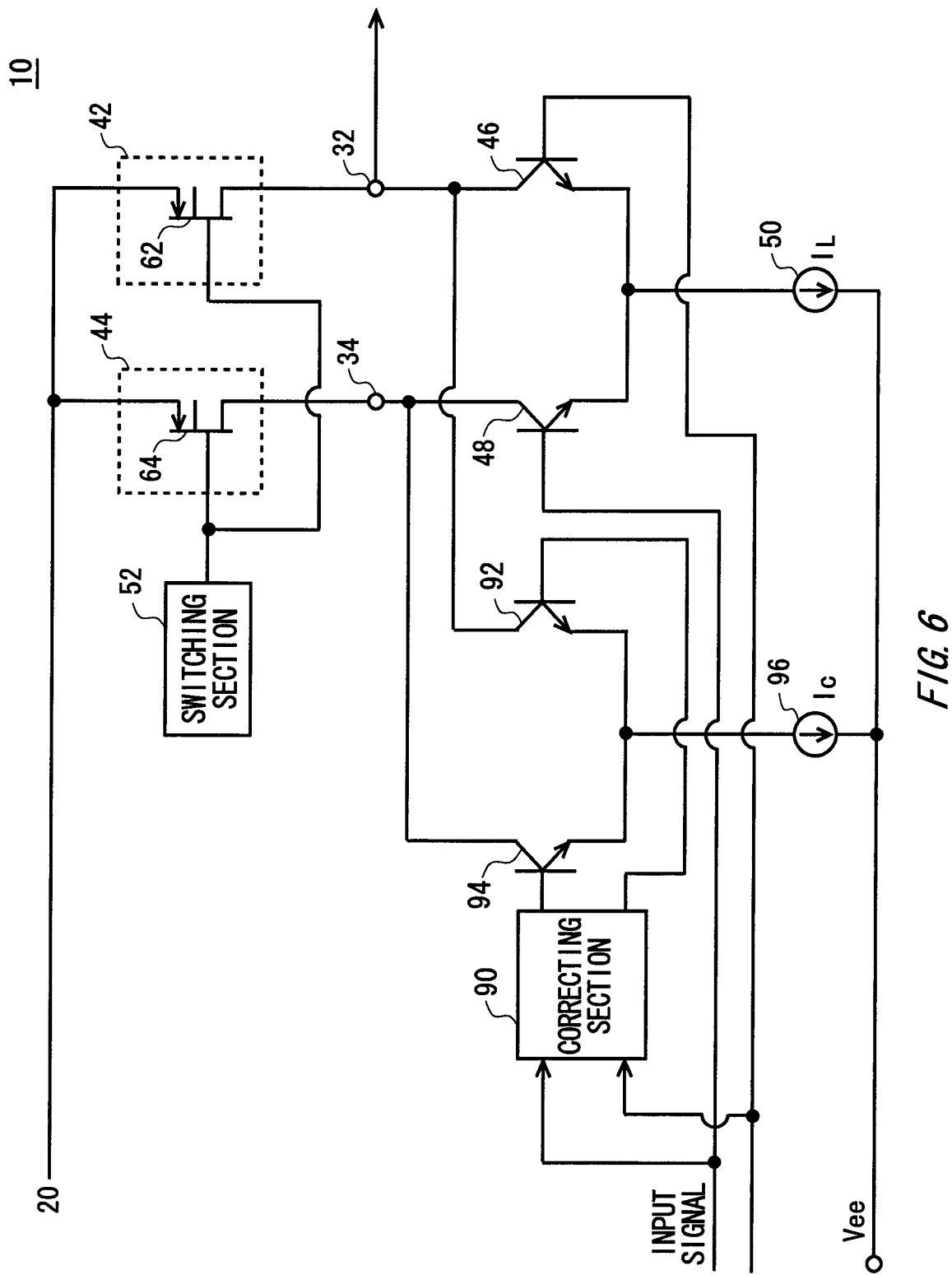
FIG. 6 shows a configuration of the driver circuit 10 according to a fourth modification of the present embodiment.

FIG. 6 shows a configuration of the driver circuit 10 according to a fourth modification of the present embodiment. The driver circuit 10 of the present modification adopts the same function and configuration as the driver circuit 10 shown in FIG. 1, and the components of the driver circuit 10 of the present modification adopt the same function and configuration as components having the same reference numeral in the driver circuit 10 described in FIG. 1. Therefore, the following description includes only differing points.

The driver circuit 10 of the present modification further includes a correcting section 90, a correcting output switching section 92, a correcting differential switching section 94, and a correcting constant current source 96. The correcting section 90 generates a differential correction signal for correcting the output signal, according to the input signal. For example, the correcting section 90 generates a differential correction signal for extracting an edge component of the input signal to emphasize a high-frequency component of the output signal.

The correcting constant current source 96 causes a prescribed correction current to flow. The correcting output switching section 92 switches the current flowing between the constant voltage source 20 and the correcting constant current source 96 via the output resistance section 42, according to the positive correction signal. The correcting differential switching section 94 switches, with an inverse phase of the correcting output switching section 92, the current flowing between the constant voltage source 20 and the correcting constant current source 96 via the differential resistance section 44, according to the negative correction signal.

In this way, the driver circuit 10 according to the present modification can output an output signal to which is added a voltage corresponding to the correction signal. For example, the driver circuit 10 of the present modification can output an output signal in which a high-frequency component that is attenuated in the transmission path is enhanced in advance.

Figure 7:
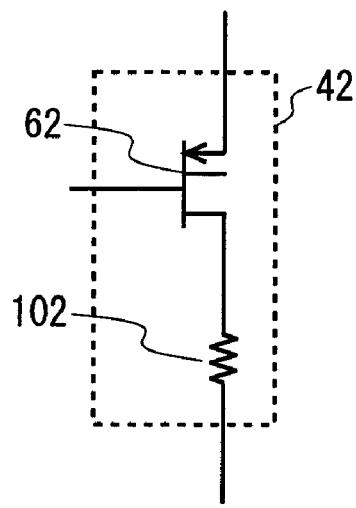
FIG. 7 shows a first exemplary configuration of the output resistance section 42 according to the present embodiment.

FIG. 7 shows a first exemplary configuration of the output resistance section 42 according to the present embodiment. The output resistance section 42 may further include an adjusting resistor 102 connected in series with the source/drain connection of the output resistance FET 62. In this way, even when the output resistance FET 62 used has a relatively small ON resistance, the output resistance section 42 can have a large overall resistance value.

Figure 8:
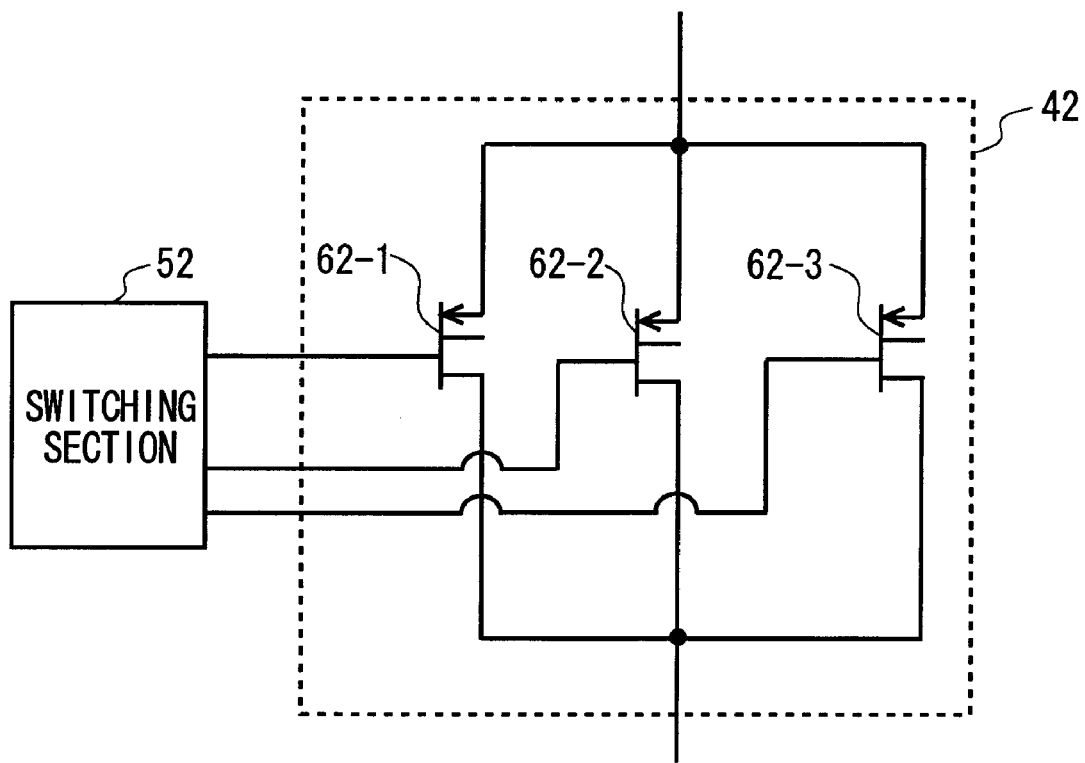
FIG. 8 shows a second exemplary configuration of the output resistance section 42 according to the present embodiment.

FIG. 8 shows a second exemplary configuration of the output resistance section 42 according to the present embodiment. The output resistance section 42 may include a plurality of output resistance FETs 62 having source/drain connections in parallel between the constant voltage source 20 and the output end 32.

When the output resistance section 42 has such a configuration, the switching section 52 supplies individual control voltages to the gates of the output resistance FETs 62, thereby changing the combined resistance of the output resistance section 42 to be the designated resistance value. In this way, the output resistance section 42 can be adjusted to have a wide range of resistance values.

The differential resistance section 44 may also have the same configuration as the output resistance sections 42 described in FIGS. 7 and 8. The output resistance FET 62 and the differential resistance FET 64 may be N-MOS transistors or P-MOS transistors.

Figure 9:
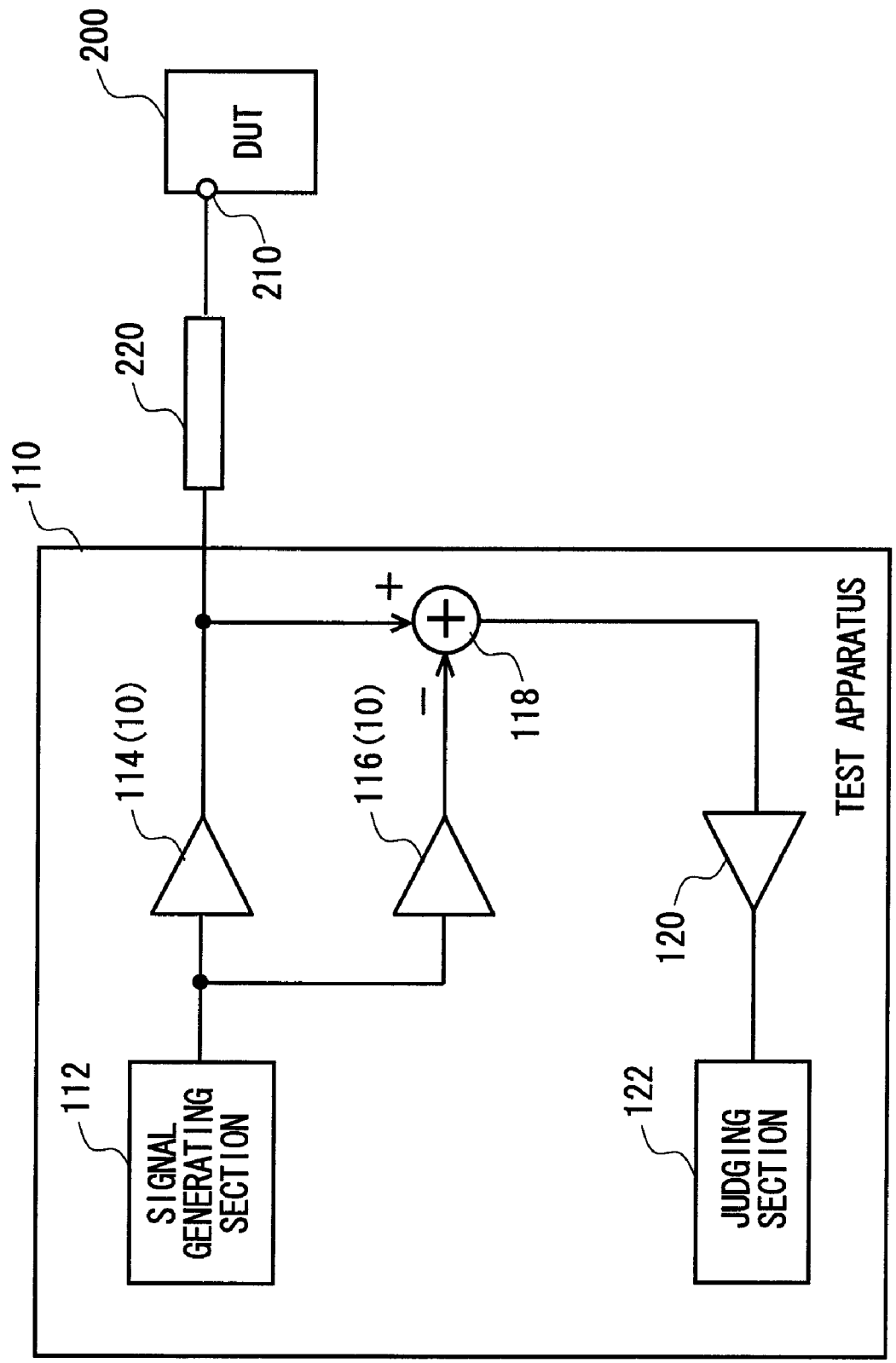
FIG. 9 shows a configuration of a test apparatus 110 according to an embodiment of the present invention, along with a device under test 200.

FIG. 9 shows a configuration of a test apparatus 110 according to an embodiment of the present invention, along with a device under test 200. The test apparatus 110 inputs an input signal to the device under test 200 via the transmission line 220 to test the device under test 200.

The test apparatus 110 is provided with a signal generating section 112, a main driver circuit 114, a replica driver circuit 116, a subtracting section 118, a comparator circuit 120, and a judging section 122. The signal generating section 112 generates a test signal to be supplied to the device under test 200.

The main driver circuit 114 supplies an input/output terminal 210 of the device under test 200 with an output signal having a voltage corresponding to the test signal. Here, the main driver circuit 114 may be the driver circuit 10 according to any of the embodiments described in relation to FIGS. 1 to 8. Therefore, the main driver circuit 114 can appropriately adjust the voltage amplitude of the test signal supplied to the device under test 200.

The replica driver circuit 116 outputs a correction signal corresponding to the test signal. For example, the replica driver circuit 116 outputs a correction signal having voltage amplitude that is half of the voltage amplitude of the test signal output from the main driver circuit 114. Here, the replica driver circuit 116 may the driver circuit 10 according to any of the embodiments described in relation to FIGS. 1 to 8. Therefore, the replica driver circuit 116 can adjust the voltage amplitude of the correction signal to be an appropriate value.

The subtracting section 118 receives the output signal from the input/output terminal 210 of the device under test 200 and subtracts the correction signal from the received output signal. The comparator circuit 120 acquires a value of the signal output from the subtracting section 118. The judging section 122 judges acceptability of the device under test 200 by comparing the value acquired by the comparator circuit 120 to an expected value.

In this way, the test apparatus 110 can send and receive signals to and from the device under test 200 via the transmission line 220 having a prescribed transmission delay. Accordingly, when the transmission time of the test signal from the test apparatus 110 to the device under test 200 and the transmission time of the output signal from the device under test 200 to the test apparatus 110 are changed by a small margin, there is a possibility that the output timing of the test signal and the input timing of the output signal will overlap at the input terminal of the comparator circuit 120.

The test apparatus 110 of the present embodiment can supply the comparator circuit 120 with a signal obtained by removing (i) a component of the test signal output from the main driver circuit 114 from (ii) the output signal from the device under test 200. In this way, the test apparatus 110 can test the device under test 200 at a high speed.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

What is claimed is:

1. A driver circuit that outputs, from an output end, an output signal corresponding to an input signal supplied thereto, comprising:
   an output resistance section that is provided between a constant voltage source and the output end, the output resistance section including an output resistance FET having a source/drain connection between the constant voltage source and the output end arranged such that a constant current flows between the source and the drain;
   an output switching section that switches voltage of the output end according to the input signal; and
   a switching section that switches a resistance value of the output resistance section, the switching section supplying a control voltage to a gate of the output resistance FET such that the resistance between the source and the drain of the output resistance FET switches to a designated value.

2. The driver circuit according to claim 1, wherein the switching section includes:
   a reference FET that is designed to have the same characteristics as the output resistance FET; and
   a control voltage applying section that supplies the gate of the output resistance FET and the gate of the reference FET with the control voltage that causes the resistance between the source and the drain of the reference FET to become the designated value.

3. A driver circuit that outputs, from an output end, an output signal corresponding to an input signal supplied thereto, comprising:
   an output resistance section that is provided between a constant voltage source and the output end;
   an output switching section that switches voltage of the output end according to the input signal;
   a switching section that switches a resistance value of the output resistance section;
   a differential resistance section that is provided between the constant voltage source and a differential end;
   a differential switching section that switches voltage of the differential end according to the input signal, with a phase that is an inverse of a phase of the output switching section; and
   a constant current source that maintains a constant value for a combination of the currents flowing through the output resistance section and the differential resistance section.

4. The driver circuit according to claim 3, wherein the output resistance section includes an output resistance FET having a source/drain connection between the constant voltage source and the output end,
the switching section includes:
   a reference FET that is designed to have the same characteristics as the output resistance FET;
   a reference FET constant current source that causes a current that is equal to a combination of the currents flowing through the output resistance section and the differential resistance section to flow between the source and the drain of the reference FET;
   a reference resistor having a predetermined resistance value;
   a reference resistance constant current source that causes the current that is equal to the combination of the currents flowing through the output resistance section and the differential resistance section to flow through the reference resistor; and
   a control voltage applying section that supplies the gate of the output resistance FET and the gate terminal of the reference FET with a control voltage that causes a voltage between the source and the drain of the reference FET to be the same as a voltage of the reference resistor.

5. The driver circuit according to claim 4, wherein the reference resistor includes:
   a plurality of resistance elements connected in parallel; and
   a plurality of fuses that are provided to correspond respectively to the plurality of resistance elements, and that each disconnect a line of one terminal of the corresponding resistance element when the supplied current is greater than or equal to a prescribed value, and
at least one of the plurality of fuses is disconnected during manufacturing, such that the reference resistor has the designated resistance value.

6. The driver circuit according to claim 3, comprising:
a plurality of constant current sources that are provided to correspond respectively to bits of an input signal expressed by a plurality of bits, each constant current source causing a current to flow that corresponds to weighting of the corresponding bit;

a plurality of output switching sections that are provided to correspond respectively to the bits of the input signal, each output switching section switching a current that flows between the constant voltage source and the corresponding constant current source via the output resistance section according to a value of the corresponding bit; and a plurality of differential switching sections that are provided to correspond respectively to the bits of the input signal, each differential switching section switching, with a phase that is an inverse of a phase of the output switching sections, a current that flows between the constant voltage source and the corresponding constant current source via the differential resistance section according to a value of the corresponding bit.

7. The driver circuit according to claim 3, further comprising:

a correcting constant current source that causes a correction current to flow;

a correcting output switching section that switches a current flowing between the constant voltage source and the correcting constant current source via the output resistance section, according to a correction signal for correcting the output signal; and a correcting differential switching section that switches, with a phase that is an inverse of a phase of the correcting output switching section, a current flowing between the constant voltage source and the correcting constant current source via the differential resistance section, according to the correction signal.

8. The driver circuit according to claim 4, wherein the output resistance section further includes an adjusting resistor connected in series with the source/drain connection of the output resistance FET.

9. The driver circuit according to claim 3, wherein the output resistance section includes a plurality of output resistance FETs having source/drain connections in parallel between the constant voltage source and the output end, and the switching section supplies individual control voltages respectively to gates of the output resistance FETs such that a combined resistance of the output resistance section changes to a designated resistance value.

10. The driver circuit according to claim 3, wherein the switching section further includes a setting section that sets a current value for current from the constant current source and a resistance value for the output resistance section, according to at least one of a designated voltage amplitude and a logic transition time.

11. A test apparatus that tests a device under test, comprising:

a signal generating section that generates a test signal supplied to the device under test; and the driver circuit according to claim 1 that supplies the device under test with an output signal corresponding to the test signal.

12. A test apparatus that tests a device under test, comprising:

a signal generating section that generates a test signal supplied to the device under test;

a main driver circuit that supplies an input/output terminal of the device under test with an output signal corresponding to the test signal;

a replica driver circuit, which is the driver circuit according to claim 1, that outputs a correction signal corresponding to the test signal;

a subtracting section that subtracts the correction signal from an output signal output by the input/output terminal of the device under test;

a comparator circuit that acquires a value of a signal output from the subtracting section; and a judging section that judges acceptability of the device under test by comparing the value acquired by the comparator circuit to an expected value.

13. A test apparatus that tests a device under test, comprising:

a signal generating section that generates a test signal supplied to the device under test; and the driver circuit according to claim 3 that supplies the device under test with an output signal corresponding to the test signal.

14. A test apparatus that tests a device under test, comprising:

a signal generating section that generates a test signal supplied to the device under test;

a main driver circuit that supplies an input/output terminal of the device under test with an output signal corresponding to the test signal;

a replica driver circuit, which is the driver circuit according to claim 3, that outputs a correction signal corresponding to the test signal;

a subtracting section that subtracts the correction signal from an output signal output by the input/output terminal of the device under test;

a comparator circuit that acquires a value of a signal output from the subtracting section; and a judging section that judges acceptability of the device under test by comparing the value acquired by the comparator circuit to an expected value.

\* \* \* \* \*